(12) United States Patent
Lin

(10) Patent No.: US 8,947,835 B2
(45) Date of Patent: *Feb. 3, 2015

(54) TUNNELING MAGNETORESISTANCE (TMR) READ SENSOR WITH A LONG DIFFUSION PATH AND EX-SITU INTERFACES IN A SENSE LAYER STRUCTURE

(75) Inventor: Tsann Lin, Saratoga, CA (US)

(73) Assignee: HGST Netherlands B.V., Amsterdam (NL)

( * ) Notice: Subject to any disclaimer, the term of this patent is extended or adjusted under 35 U.S.C. 154(b) by 135 days.

This patent is subject to a terminal disclaimer.

(21) Appl. No.: 13/335,642

(22) Filed: Dec. 22, 2011

(65) Prior Publication Data

US 2013/0164562 A1 Jun. 27, 2013

(51) Int. Cl.
*G11B 5/39* (2006.01)
*G11B 5/40* (2006.01)

(52) U.S. Cl.
CPC ............... *G11B 5/3906* (2013.01); *G11B 5/40* (2013.01)
USPC ............... 360/324.12; 360/324.2; 428/811.1; 428/811.2; 428/811.5

(58) Field of Classification Search
None
See application file for complete search history.

(56) References Cited

U.S. PATENT DOCUMENTS

| | | | |
|---|---|---|---|
| 7,333,306 B2 | 2/2008 | Zhao et al. | |
| 7,695,761 B1 | 4/2010 | Shen et al. | |
| 7,800,868 B2 | 9/2010 | Gao et al. | |
| 8,164,863 B2 * | 4/2012 | Lin | 360/324.12 |
| 8,817,426 B2 * | 8/2014 | Gao et al. | 360/324.11 |
| 2005/0052793 A1 | 3/2005 | Hong et al. | |
| 2007/0047159 A1 * | 3/2007 | Zhao et al. | 360/324.12 |
| 2009/0121710 A1 | 5/2009 | Wang et al. | |
| 2009/0155629 A1 | 6/2009 | Gill | |
| 2009/0168271 A1 | 7/2009 | Mauri et al. | |
| 2009/0174971 A1 * | 7/2009 | Tsuchiya et al. | 360/324.2 |
| 2009/0244791 A1 * | 10/2009 | Lin | 360/324.2 |
| 2009/0269617 A1 * | 10/2009 | Zhang et al. | 428/811.1 |
| 2010/0073827 A1 * | 3/2010 | Zhao et al. | 360/324.2 |
| 2010/0073828 A1 | 3/2010 | Wang et al. | |
| 2010/0177449 A1 | 7/2010 | Zhao et al. | |
| 2011/0051291 A1 * | 3/2011 | Miyauchi et al. | 360/245.3 |
| 2011/0081558 A1 * | 4/2011 | Lin | 428/811.1 |
| 2011/0091744 A1 * | 4/2011 | Kawamori et al. | 428/810 |
| 2011/0096443 A1 * | 4/2011 | Zhang et al. | 360/324.2 |
| 2011/0188157 A1 | 8/2011 | Zhao et al. | |
| 2013/0001189 A1 * | 1/2013 | Zhao et al. | 216/22 |
| 2013/0128391 A1 * | 5/2013 | Fuji et al. | 360/324.12 |

OTHER PUBLICATIONS

Tsunekawa et al., "Huge Magnetoresistance and Low Junction Resistance in Magnetic Tunnel Junctions With Crystalline MgO Barrier," 2006 IEEE, IEEE Transactions on Magnetics, vol. 42, No. 2, Feb. 2006, pp. 103-107.

* cited by examiner

*Primary Examiner* — Kevin Bernatz
(74) *Attorney, Agent, or Firm* — Zilka-Kotab, PC

(57) ABSTRACT

The invention provides a tunneling magnetoresistance (TMR) read sensor with a long diffusion path and ex-situ interfaces in a sense layer structure. The sense layer structure comprises a first sense layer preferably formed of a ferromagnetic Co—Fe film, a second sense layer preferably formed of a ferromagnetic Co—Fe—B film, and a third sense layer preferably formed of a ferromagnetic Ni—Fe film. The sense layer structure has a long diffusion path (defined as a total thickness of the first and second sense layers) and ex-situ interfaces for suppressing unwanted diffusions of Ni atoms. Alternatively, the sense layer structure comprises a first sense layer preferably formed of a ferromagnetic Co—Fe film, a second sense layer preferably formed of a ferromagnetic Co—Fe—B film, a third sense layer preferably formed of a ferromagnetic Co—Fe—B—Hf film, and a fourth sense layer preferably formed of a ferromagnetic Ni—Fe film.

8 Claims, 14 Drawing Sheets

TUNNELING MAGNETORESISTANCE (TMR) READ SENSOR WITH A LONG DIFFUSION PATH AND EX-SITU INTERFACES IN A SENSE LAYER STRUCTURE

FIELD OF THE INVENTION

The invention relates to non-volatile magnetic storage devices and more particularly to a magnetic disk drive including a tunneling magnetoresistance (TMR) read sensor with a long diffusion path and ex-silo interfaces in a sense layer structure.

BACKGROUND OF THE INVENTION

One of many extensively used non-volatile magnetic storage devices is a magnetic disk drive that includes a rotatable magnetic disk and an assembly of write and read heads. The assembly of write and read heads is supported by a slider that is mounted on a suspension arm. The suspension arm is supported by an actuator that can swing the suspension arm to place the slider with its air bearing surface (ABS) over the surface of the magnetic disk.

When the magnetic disk rotates, an air flow generated by the rotation of the magnetic disk causes the slider to fly on a cushion of air at a very low elevation (fly height) over the magnetic disk. When the slider rides on the air, the actuator moves the suspension arm to position the assembly of write and read heads over selected data tracks on the magnetic disk. The write and read heads write and read data in the selected data tracks, respectively. Processing circuitry connected to the write and read heads then operates according to a computer program to implement writing and reading functions, respectively.

The write head includes a magnetic write pole and a magnetic return pole that are magnetically connected with each other at a region away from the ABS, and an electrically conductive write coil surrounding the magnetic write pole. In a writing process, the electrically conductive write coil induces magnetic fluxes in the magnetic write pole. The magnetic fluxes form a magnetic write field emitting from the magnetic write pole to the magnetic disk in a direction perpendicular to the surface of the magnetic disk. The magnetic write field writes data in the selected data tracks, and then returns to the magnetic return pole so that it will not erase previously written data in adjacent data tracks.

The read head includes a read sensor that is electrically connected with lower and upper ferromagnetic shields, but is electrically separated by insulation layers from longitudinal bias layers in two side regions. In a reading process, the read head passes over data in a selected data track, and magnetic fields emitting from the data modulate the resistance of the read sensor. A change in the resistance of the read sensor is detected by a sense current passing through the read sensor, and is then converted into a voltage change that generates a read signal. The resulting read signal is used to decode data in the selected data track.

A tunneling magnetoresistance (TMR) read sensor is typically used in the read head. The TMR read sensor includes a nonmagnetic insulating barrier layer sandwiched between a ferromagnetic reference layer and a ferromagnetic sense layer. The thickness of the barrier layer is chosen to be less than the mean free path of conduction electrons passing through the TMR read sensor. The magnetization of the reference layer is pinned in a direction perpendicular to the ABS, while the magnetization of the sense layer is oriented in a direction parallel to the ABS. When passing the sense current through the TMR read sensor, the conduction electrons are scattered at lower and upper interfaces of the barrier layer. When receiving a magnetic field emitting from data in the selected data track, the magnetization of the reference layer remains pinned while that of the sense layer rotates. Scattering decreases as the magnetization of the sense layer rotates towards that of the reference layer, or increases as the magnetization of the sense layer rotates away from that of the reference layer. This scattering variation induces a TMR effect characterized by a change in the resistance of the TMR read sensor in proportion to the magnitude of the magnetic field and $\cos\theta$, where $\theta$ is an angle between the magnetizations of the reference and sense layers. The change in the resistance of the TMR read sensor is then detected by the sense current and converted into a voltage change that is processed as a read signal.

The TMR read sensor has been progressively miniaturized for magnetic recording at higher linear and track densities. To increase linear densities, its thickness, which defines a read gap, is reduced by utilizing thinner reference, barrier, sense or other layers. To increase track densities, its width, which defines a track width, is reduced by patterning with an advanced photolithographic tool. In addition, to increase signal sensitivity for compensating signal losses caused by the reductions of its thickness and width, its length, which defines a stripe height, is also reduced by deeper chemical mechanical polishing.

In this miniaturized TMR read sensor, a junction area ($R_J$) defined by its width and length becomes so small that its junction resistance ($A_J$) will be too high to maintain low electronic noises and prevent electrostatic discharges. In addition, a junction volume defined by its width, length and thickness becomes so small that its magnetic excitation will be too high to maintain low magnetic noises. In this sensor miniaturization progress, it is challenging to maintain the electrical resistance of less than 400Ω for minimizing electronic noises and preventing electrostatic discharges, and to ensure a pinning field of more than 1,200 Oe for minimizing magnetic noises though rigidly pinning the magnetization of the reference layer. In any approaches to minimizing the electrical and magnetic noises, it is also challenging for the TMR read sensor to maintain a high TMR effect and thus to perform the magnetic recording with a high signal-to-noise ratio.

SUMMARY OF THE INVENTION

The invention provides a tunneling magnetoresistance (TMR) read sensor with a long diffusion path and ex-situ interfaces in a sense layer structure. The sense layer structure comprises a first sense layer preferably formed of a ferromagnetic Co—Fe film, a second sense layer preferably formed of a ferromagnetic Co—Fe—B film, and a third sense layer preferably formed of a ferromagnetic Ni—Fe film. The sense layer structure has a long diffusion path (defined as a total thickness of the first and second sense layers) and ex-situ interfaces for suppressing unwanted diffusions of Ni atoms. Alternatively, the sense layer structure comprises a first sense layer preferably formed of a ferromagnetic Co—Fe film, a second sense layer preferably formed of a ferromagnetic Co—Fe—B film, a third sense layer preferably formed of a ferromagnetic Co—Fe—B—Hf film, and a fourth sense layer preferably formed of a ferromagnetic Ni—Fe film. The sense layer structure has a long diffusion path (defined as a total thickness of the first, second and third sense layers) reinforced by light doping of Hf atoms into the third sense layers, and ex-situ interfaces for suppressing the unwanted diffusions of Ni atoms.

These and other features and advantages of the invention will be apparent upon reading of the following detailed description of embodiments taken in conjunction with the figures in which like reference numerals indicate like elements throughout.

BRIEF DESCRIPTION OF THE DRAWINGS

For a fuller understanding of the nature and advantages of the invention, as well as the preferred mode of use, reference should be made to the following detailed description read in conjunction with the accompanying drawings which are not to scale.

Table 1 is a table listing $H_F$, $R_J A_J$, $\Delta R_T/R_J$ and FoM for TMR read sensors with Co—Fe(0.8)/Co—Fe—B(4.8), Co—Fe(0.8)/Co—Fe—B(1.2)/Co—Hf(1.2)/Ni—Fe(4.8), Co—Fe(0.8)/Co—Fe—B(2.4)/Ni—Fe(4.0) and Co—Fe(0.8)/Co—Fe—B(3.2)/Ni—Fe(2.8) sense layers after annealing for 5 hours at 280° C.

Table 2 is a table listing $H_F$, $R_J A_J$, $\Delta R_T/R_J$ and FoM for TMR read sensors with Co—Fe(0.8)/Co—Fe—B(1.2)/Co—Hf(1.2)/Ni(5.6) and Co—Fe(0.8)/Co—Fe—B(2.4)/Ni(4.8) sense layers after annealing for 5 hours at 280° C.

Table 3 is a table listing $H_F$, $R_J A_J$, $\Delta R_T/R_J$ and FoM for TMR read sensors with Co—Fe(0.8)/Co—Fe—B(1.6)/Co—Hf(1.2)/Ni(5.0), Co—Fe(0.8)/Co—Fe—B(3.2)/Ni(4.0) and Co—Fe(0.8)/Co—Fe—B(1.6)/Co—Fe—B—Hf(1.6)/Ni(4.8) sense layers after annealing for 5 hours at 280° C.

DETAILED DESCRIPTION OF THE EMBODIMENTS

The following description is of the best embodiments presently contemplated for carrying out the invention. This description is made for the purpose of illustrating general principles oldie invention and is not meant to limit inventive concepts claimed herein.

Figure 1:
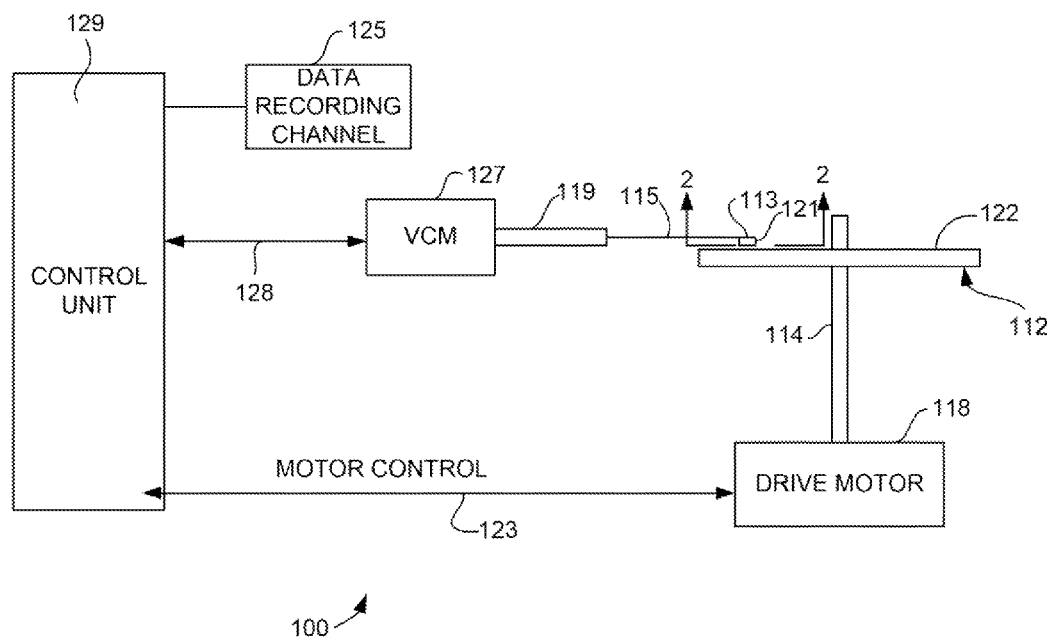
FIG. 1 is a schematic illustration of a magnetic disk drive in which the invention is embodied.

Referring now to FIG. 1, there is shown a magnetic disk drive 100 embodying the invention. As shown in FIG. 1, at least one rotatable magnetic disk 112 is supported on a spindle 114 and rotated by a disk drive motor 118. Magnetic recording on each magnetic disk 112 is performed at annular patterns of data tracks (not shown) on the magnetic disk 112.

At least one slider 113 is positioned near the magnetic disk 112, each slider 113 supporting one assembly of write and read heads 121. As the magnetic disk 112 rotates, the slider 113 moves radially in and out over the disk surface 122 so that the assembly of write and read heads 121 may access different data tracks on the magnetic disk 112. Each slider 113 is mounted on a suspension arm 115 that is supported by an actuator 119. The suspension arm 115 provides a slight spring force which biases the slider 113 against the disk surface 122. Each actuator 119 is attached to an actuator means 127 that may be a voice coil motor (VCM). The VCM comprises a coil movable within a fixed magnetic field, the direction and speed of the coil movements being controlled by motor current signals supplied by a control unit 129.

During operation of the magnetic disk drive 100, the rotation of the magnetic disk 112 generates an air bearing between the slider 113 and the disk surface 122, which exerts an upward force or lift on the slider 113. The air bearing thus counter-balances the slight spring force of the suspension arm 115 and supports the slider 113 off and slightly above the disk surface 122 by a small, substantially constant spacing during sensor operation.

The various components of the magnetic disk drive 100 are controlled in operation by control signals generated by the control unit 129, such as access control and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the magnetic disk 112. Write and read signals are communicated to and from the assembly of write and read heads 121 by way of a recording channel 125.

Figure 2:
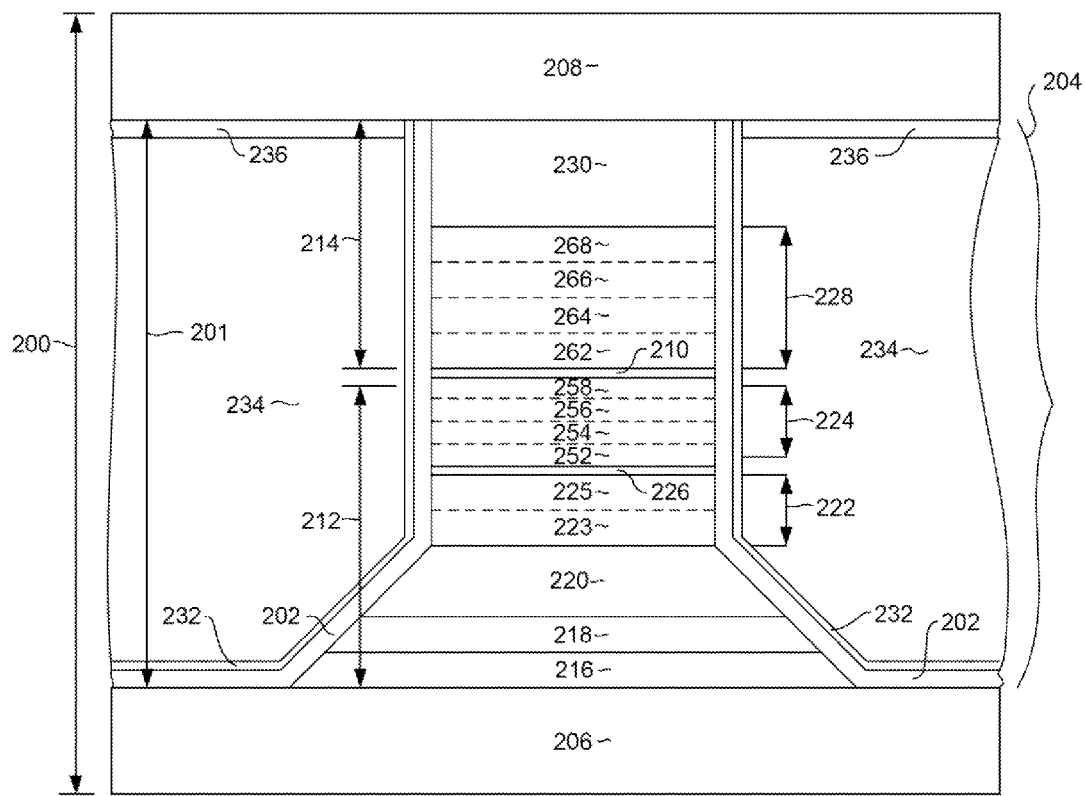
FIG. 2 is an ABS schematic view of a read head in accordance with a prior art.

FIG. 2 shows a read head 200 in accordance with a prior art, where a tunneling magnetoresistance (TMR) read sensor 201 is electrically connected with lower and upper ferromagnetic shields 206, 208 to allow a sense current to flow in a direction perpendicular to planes of the TMR read sensor 201, but is electrically insulated by insulation layers 202 from longitudinal bias stacks 204 in two side regions to prevent the sense current from shunting through the two side regions.

The TMR read sensor 201 includes an electrically insulating $MgO_x$ barrier layer 210 sandwiched between lower and upper sensor stacks 212, 214. The $MgO_x$ barrier layer 210 is formed of a 0.1 nm thick oxygen-doped Mg (Mg—O) film, a 0.6 nm thick oxide (MgO) film, and another 0.1 nm thick oxygen-doped Mg (Mg—O) film.

The lower sensor stack 212 comprises a buffer layer 216 formed of a 2 nm thick nonmagnetic Ta film, a seed layer 218 formed of a 2 nm thick nonmagnetic Ru film, a pinning layer 220 formed of a 6 nm thick antiferromagnetic 23.2Ir-76.8Mn (composition in atomic percent) film, a keeper layer structure 222, an antiparallel-coupling layer 226 formed of a 0.4 nm thick nonmagnetic Ru film, and a reference layer structure 224. The keeper layer structure 222 comprises a first keeper layer 223 formed of a 1.6 nm thick ferromagnetic 72.5Co-27.5Fe film and a second keeper layer 225 formed of a 0.6 nm thick ferromagnetic Co film. The thicknesses of the first keeper layer 223 and the second keeper layer 225 are selected for the keeper layer structure 222 to exhibit a total saturation areal moment of 0.32 memu/cm$^2$ (corresponding to that of a 4.6 nm thick ferromagnetic 88Ni-12Fe film sandwiched between two Cu films). The reference layer structure 224 comprises a first reference layer 252 formed of a 0.6 nm thick ferromagnetic Co film, a second reference layer 254 formed of a 0.6 nm thick ferromagnetic 75.5Co-24.5Hf film, a third reference layer 256 formed of a 0.6 nm thick ferromagnetic 65.5Co-19.9Fe-14.613 film, and a fourth reference layer 258 formed of a 0.6 nm thick ferromagnetic 46.8Co-53.2 Fe film. The thicknesses of the first reference layer 252, the second reference layer 254, the third reference layer 256 and the fourth reference layer 258 are selected for the reference layer structure 224 to exhibit a total saturation areal moment of 0.30 memu/cm$^2$ (corresponding to that of a 4.3 nm thick ferromagnetic 88Ni-12Fe film sandwiched between two Cu films).

The upper sensor stack 214 comprises a sense layer structure 228 and a cap layer structure 230. The sense layer structure 228 comprises a first sense layer 262 formed of a 0.8 nm thick ferromagnetic 46.8Co-53.2Fe film, a second sense layer 264 formed of a 1.2 nm thick ferromagnetic 79.3Co-4.0Fe-16.713 film, a third sense layer 266 formed of a 1.2 nm thick ferromagnetic 75.5Co-24.5Hf film, and a fourth sense layer 268 formed of a 4.8 nm thick ferromagnetic 96Ni-4Fe film. Thicknesses of the first sense layer 262, the second sense layer 264, the third sense layer 266 and the fourth sense layer 268 are selected for the sense layer structure 228 to exhibit a total saturation areal moment of 0.56 memu/cm$^2$ (corresponding to that of an 8 nm thick ferromagnetic 88Ni-12Fe film sandwiched between two Cu films). The cap layer structure 230 comprises a first cap layer formed of a 1 nm thick nonmagnetic Ru film, a second cap layer formed of a 1 nm thick nonmagnetic Ta film, and a third cap layer formed of a 4 nm thick nonmagnetic Ru film.

A typical insulation layer 202 in each side region is formed of a 2 nm thick nonmagnetic, amorphous $Al_2O_3$ film. A typical longitudinal bias stack 204 in each side region comprises a seed layer 232 formed of a 4 nm thick nonmagnetic Cr film, a longitudinal bias layer 234 formed of a 25.6 nm thick hard-magnetic 82Co-18Pt film, and a cap layer 236 formed of a 10 nm thick nonmagnetic Cr film. The thickness of the Co—Pt longitudinal layer 234 is selected to attain a remnant areal moment of 2.24 memu/cm$^2$ (corresponding to that of a 32 nm thick ferromagnetic 88Ni-12Fe film sandwiched between two Cu films).

In the fabrication process of the read head 200, the TMR read sensor 201 is deposited on a wafer with a lower shield 206 formed of a 1 μm thick ferromagnetic 80Ni-20Fe film in various deposition modules of a sputtering system, and is annealed with a magnetic field of 50,000 Oe for 5 hours at 280° C. in a high-vacuum oven. The TMR read sensor 201 is patterned in a photolithographic process to produce sensor front and rear edges, and then patterned again in another photographic process to produce sensor tails at the two side regions. The $Al_2O_3$ insulation layer 202 and the longitudinal bias stack 204 are then deposited into the two side regions. The photoresist is then removed and a chemical-mechanical-polishing process is conducted. The TMR read sensor 201, the $Al_2O_3$ insulation layer 202, and the longitudinal bias stack 204 are then covered by the upper shield 208 also formed of a 1 μm thick ferromagnetic 80Ni-20Fe film, and by a gap formed of a 100 nm thick nonmagnetic $Al_2O_3$ film. After completing the read head fabrication process, the write head fabrication process starts.

The keeper layer structure 222, the antiparallel-coupling layer 226 and the reference layer structure 224 form a flux closure where four magnetic interactions occur. First, antiferromagnetic/ferromagnetic coupling occurs between the pinning layer 220 and the keeper layer structure 222, thus increasing the easy-axis coercivity ($H_{CE}$) of the keeper layer structure 222 and inducing a unidirectional anisotropy field ($H_{UA}$). Second, ferromagnetic/ferromagnetic coupling occurs across the antiparallel-coupling layer 226 and between the keeper layer structure 222 and the reference layer structure 224, thus inducing a bidirectional anisotropy field ($H_{BA}$). Third, ferromagnetic/ferromagnetic coupling also occurs across the barrier layer 210 and between the reference structure 224 and the sense layer structure 228, thus increasing the easy-axis coercivity ($H_C$) of the sense layer structure 228 and inducing a ferromagnetic-coupling field ($H_F$). Fourth, magnetostatic interaction occurs in the sense layer structure 228 due to stray fields that stem from the net magnetization of the keeper layer structure 222 and the reference layer structure 224, thus inducing a demagnetizing field ($H_D$). To ensure proper sensor operation, $H_{UA}$ and $H_{BA}$ must be high enough to rigidly pin the magnetizations of the keeper layer structure 222 and the reference layer structure 224 in opposite transverse directions perpendicular to the ABS, while $H_F$ and $H_D$ must be small and balance with each other to orient the magnetization of the sense layer structure 228 in a longitudinal direction parallel to the ABS.

When a sense current flows in a direction perpendicular to planes of the TMR read sensor 201, its areal resistance can be characterized by a product of junction resistance and area ($R_J A_J$). For a TMR read sensor 201 with $R_J A_J$=1 Ω-μm$^2$, its $R_J$ will be 100Ω when its $A_J$ is 1,000 nm×1,000 nm, and will be 400Ω when $A_J$ is 500 nm×500 nm. It is thus important for the TMR read sensor 201 to exhibit lower $R_J A_J$, so that its $R_J$ can be still below 400Ω when its $A_J$ is below 500 nm×500 nm after the sensor miniaturization process. When the sense current quantum-jumps across the $MgO_x$ barrier layer 210 and a magnetic field rotates the magnetization of the sense layer structure 228 from the same direction as that of the reference layer structure 224 to an opposite direction, scattering of conduction electrons at lower and upper interfaces of the $MgO_x$ barrier layer 210 induces the TMR effect and causes an increase in the junction resistance from $R_J$ to $R_J+\Delta R_T$. The strength of this TMR effect can be characterized by $\Delta R_T/R_J$ defined as a TMR coefficient. It is also important for the TMR read sensor 201 with a lower $R_J A_J$ to still maintain a high $\Delta R_T/R_J$. The TMR read sensor 201 can thus exhibit a higher ratio of $\Delta R_T/R_J$ to $R_J A_J$, which is proportional to a signal amplitude and thus a figure of merit (FoM) of the signal amplitude.

The Co—Hf sense layer 266 in the sense layer structure 228 also acts as a diffusion barrier layer that suppresses diffusions of Ni atoms from the Ni—Fe sense layer 268 into the Co—Fe—B sense layer 264, the Co—Fe sense layer 262 and the MgO$_x$ barrier layer 210. By suppressing the diffusions of Ni atoms, the sense layer structure 228 can exhibit softer ferromagnetic properties, such as a lower $H_C$, a lower $H_F$ and a lower saturation magnetostriction ($\lambda_S$), and the TMR read sensor 201 can exhibit a higher $\Delta R_T/R_J$ at a lower $R_J A_J$. In contrast to another previously used Ta diffusion barrier layer that is nonmagnetic and may induce a multi-domains state in the sense layer structure 228, the Co—Hf sense layer 266 is ferromagnetic and thus may maintain a single-domain state in the sense layer structure 228. Since the single-domain state leads to less magnetic noises than the multi-domain state, the Co—Hf sense layer 266 is thus considered a better diffusion barrier layer than the Ta diffusion barrier layer. To further reduce magnetic noise, it is desirable to eliminate the Co—Hf sense layer 266 and thus simplify the sense layer structure 228. However, the Ni—Fe sense layer 268 will directly contact the Co—Fe—B sense layer 266, causing the diffusions of Ni atoms and thus deteriorating the soft ferromagnetic properties and the TMR effect. It is found in the invention, unexpectedly, that it is feasible to entirely remove the Co—Hf sense layer 266 while still maintaining the soft ferromagnetic properties and the TMR effect.

Figure 3:
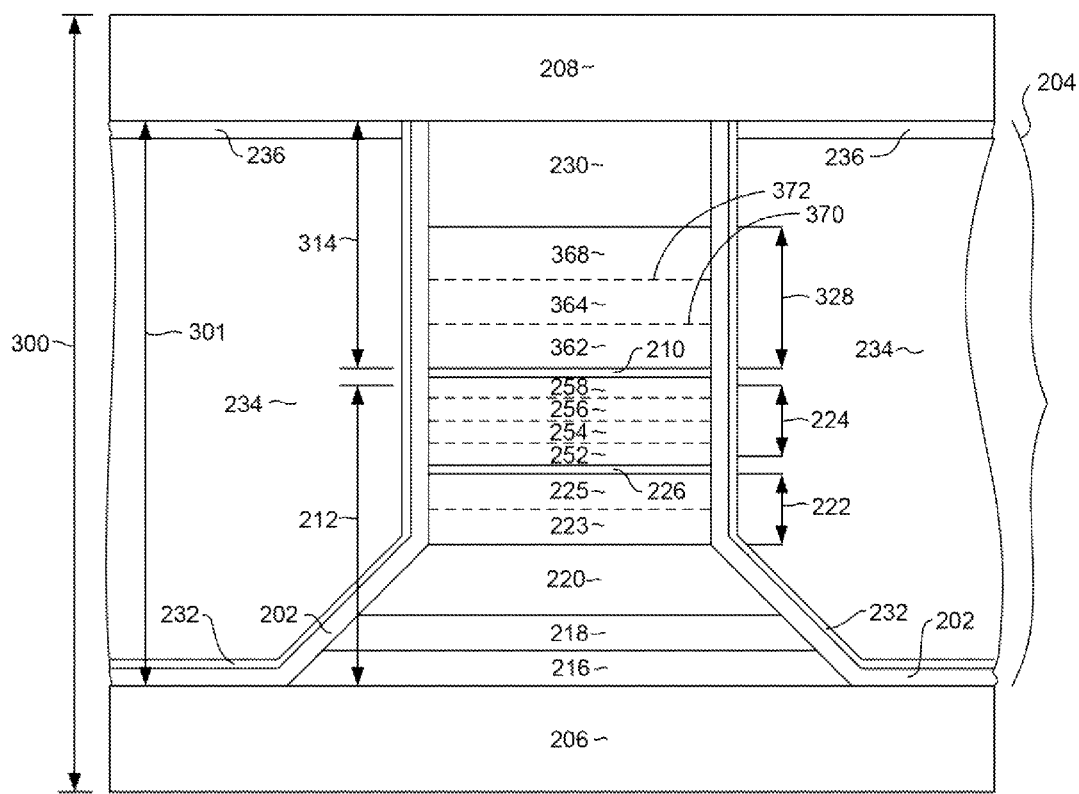
FIG. 3 is an ABS schematic view of a read head in accordance with a preferred embodiment of the invention.

FIG. 3 shows a read head 300 in accordance with a preferred embodiment of the invention. The read head 300 is basically identical to the read head 200 except the sense layer structure 328 in the upper sensor stack 314 of the TMR read sensor 301. The sense layer structure 328 comprises a first sense layer 362 preferably formed of a 0.8 nm thick ferromagnetic 46.8Co-53.2Fe film, a second sense layer 364 preferably formed of a 3.2 nm thick ferromagnetic 79.3Co-4.0Fe-16.7B film, a third sense layer 368 preferably formed of a 2.8 nm thick ferromagnetic 96Ni-4Fe film, an ex-situ interface 370 between the first sense layer 362 and the second sense layer 364, and an ex-situ interface 372 between the second sense layer 364 and the third sense layer 368. The total thickness of the first sense layer 362 and the second sense layer 364 is large enough to form a long diffusion path for trapping Ni atoms. The thicknesses of the third sense layer 368 is adjusted accordingly for the sense layer structure 328 to preferably exhibit a total saturation areal moment of 0.56 menu/cm$^2$ (corresponding to that of an 8 nm thick ferromagnetic 88Ni-12Fe film sandwiched between two Cu films).

Figure 4:
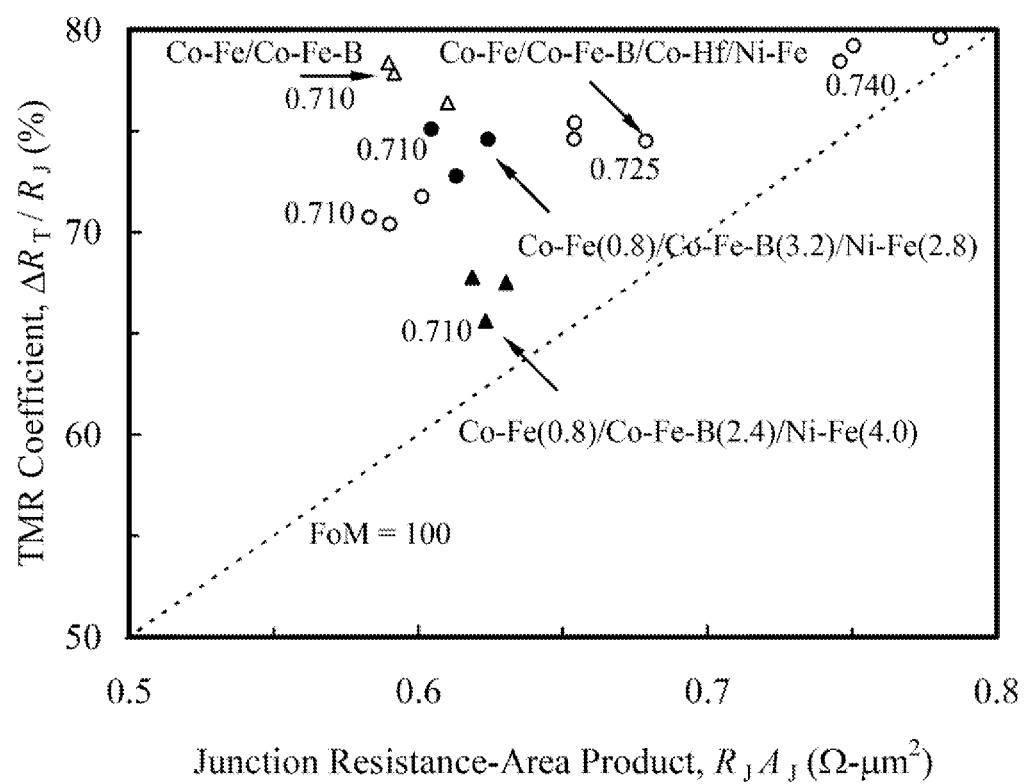
FIG. 4 is a chart showing $\Delta R_T/R_J$ versus $R_J A_J$ for TMR read sensors with Co—Fe(0.8)/Co—Fe—B(4.8), Co—Fe(0.8)/Co—Fe—B(1.2)/Co—Hf(1.2)/Ni—Fe(4.8), Co—Fe(0.8)/Co—Fe—B(2.4)/Ni—Fe(4.0) and Co—Fe(0.8)/Co—Fe—B(3.2)/Ni—Fe(2.8) sense layers after annealing for 5 hours at 280° C.

FIG. 4 shows $\Delta R_T/R_J$ versus $R_J A_J$ for TMR read sensors 201, 301 with Co—Fe(0.8)/Co—Fe—B(4.8), Co—Fe(0.8)/Co—Fe—B(1.2)/Co—Hf(1.2)/Ni—Fe(4.8), Co—Fe(0.8)/Co—Fe—B(2.4)/Ni—Fe(4.0) and Co—Fe(0.8)/Co—Fe—B(3.2)/Ni—Fe(2.8) sense layers after annealing for 5 hours at 280° C. Various sense layers in the sense layer structures 228, 328 are deposited in more than one deposition module, and thus ex-sitar interfaces are automatically formed in the sense layer structures 228, 328 whenever the wafer is transferred through a low-vacuum transfer module. The term "ex-situ" used in the invention strictly means that the wafer is exposed to low vacuum, instead of air in general. The thickness of the MgO$_x$ barrier layer 210 is labeled at data points. For the TMR read sensors 201, 301 with 0.710 nm thick MgO$_x$ barrier layers 210, the entire removal of the Co—Hf sense layer 266 only causes an $R_J A_J$ increase by no more than 0.03 $\Omega$-$\mu$m$^2$. Therefore, with a long diffusion path and ex-situ interfaces automatically formed in the sense layer structure 328, Ni atoms might be trapped effectively in the Co—Fe—B sense layer 364 and cannot reach the MgO$_x$ barrier layer 210 to cause a substantial $R_J A_J$ increase.

Table 1 lists $H_F$, $R_J A_J$, $\Delta R_T/R_J$ and FoM for the TMR read sensors 201, 301 with 0.710 nm thick MgO$_x$ barrier layers 210 and various sense layers corresponding to those shown in FIG. 4. The TMR read sensor with the Co—Fe/Co—Fe—B sense layers exhibits $H_F$ of as low as 113.0 Oe and $\Delta R_T/R_J$ of as high as 76.9% at $R_J A_J$ of 0.60 $\Omega$-$\mu$m$^2$ (corresponding to FoM of as high as 127.5). In spite of theses good magnetic and TMR properties, this TMR read sensor is not viable since it exhibits $\lambda_S$ of as high as $3.88 \times 10^{-6}$. By replacing a large upper portion of the Co—Fe—B sense layer with the Co—Hf sense layer 266 and the Ni—Fe sense layer 268, $\lambda_S$ reaches as low as $-0.53 \times 10^{-6}$, $H_F$ as low as 119.7.0 Oe, and $\Delta R_T/R_J$ as high as 71.0% at $R_J A_J$ of 0.59 $\Omega$-$\mu$m$^2$ (corresponding to FoM of as high as 120.0). The Co—Hf sense layer 266 thus acts as a viable diffusion barrier layer to the Ni—Fe sense layer 268, so that the Ni—Fe sense layer 268 can facilitate the TMR read sensor 201 to exhibit good soft ferromagnetic properties such as a low $H_F$ and a negative $\lambda_S$.

On the other hand, by replacing the large upper portion of the Co—Fe—B sense layer with a 5.6 nm thick Ni—Fe sense layer 368 only, the TMR read sensor exhibits very low $\Delta R_T/R_J$ at very high $R_J A_J$ (not shown), mainly due to severe Ni diffusions into the Co—Fe—B sense layer 364, the Co—Fe sense layer 362, and the MgO$_x$ barrier layer 210. Surprisingly, by replacing a small upper portion of the Co—Fe—B sense layer with a 4.0 or 2.8 nm thick Ni—Fe sense layer 368, the TMR read sensor 301 still exhibits good magnetic and TMR properties. As shown in Table 1, when the Co—Fe—B sense layer 364 is as thick as 2.4 nm, the TMR read sensor 301 exhibits $\lambda_S$ of $0.41 \times 10^{-6}$, of as low as 98.9 Oe, and $\Delta R_T/R_J$ of as high as 67.0% at $R_J A_J$ of 0.62 $\Omega$-$\mu$m$^2$ (corresponding to FoM of as high as 107.3). When the Co—Fe—B sense layer 364 is as thick as 3.2 nm, $\lambda_S$ reaches as high as $1.79 \times 10^{-6}$, $H_F$ as low as 96.8 Oe, and $\Delta R_T/R_J$ as high as 74.2% at $R_J A_J$ of 0.61 $\Omega$-$\mu$m$^2$ (corresponding to FoM of as high as 120.8). Therefore, when the Co—Fe—B sense layer 364 is thicker than a scattering path where conduction electrons will scatter to induce the TMR effect and than a diffusion path where Ni atoms might be trapped, and when the ex-situ interface suppresses the Ni diffusions, the TMR read sensor 301 can still exhibit TMR properties comparable with the TMR read sensor 201.

TABLE 1

| Co—Fe (nm) | Co—Fe—B (nm) | Co—Hf (nm) | Ni—Fe (nm) | $\lambda_S$ ($\times 10^{-6}$) | $H_F$ (Oe) | $R_J A_J$ ($\Omega$-$\mu$m$^2$) | $\Delta R_T/R_J$ (%) | FoM |
|---|---|---|---|---|---|---|---|---|
| 0.8 | 4.8 | 0 | 0 | 3.88 | 113.0 | 0.60 | 76.9 | 127.5 |
| 0.8 | 1.2 | 1.2 | 4.8 | −0.53 | 119.7 | 0.59 | 71.0 | 120.0 |
| 0.8 | 2.4 | 0 | 4.0 | 0.41 | 98.9 | 0.62 | 67.0 | 107.3 |
| 0.8 | 3.2 | 0 | 2.8 | 1.79 | 96.8 | 0.61 | 74.2 | 120.8 |

It should be noted though that the Ni—Fe sense layer 368 cannot be thick enough for the sense layer structure 328 to exhibit a negative $\lambda_S$. To decrease $\lambda_S$, the Ni—Fe sense layer 368 with a saturation magnetization ($M_S$) of 544 memu/cm³ is replaced by a thicker Ni sense layer 368 with $M_S$ of 463 memu/cm³. By eliminating Fe atoms, $\lambda_S$ is expected to be substantially decreased. In addition, to further reinforce the strength of the ex-situ interface against the Ni diffusion, the wafer can be further exposed to another low vacuum in other modules for longer time, as described below.

Figure 5:
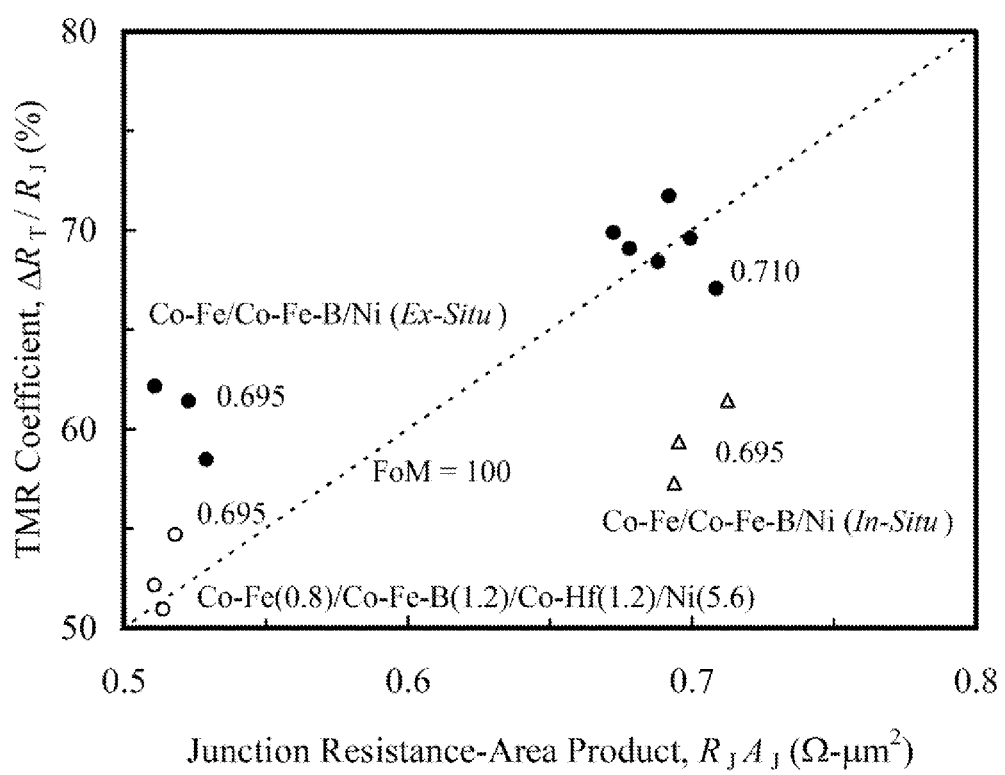
FIG. 5 is a chart showing $\Delta R_T/R_J$ versus $R_J A_J$ for TMR read sensors with Co—Fe(0.8)/Co—Fe—B(1.2)/Co—Hf(1.2)/Ni(5.6) and Co—Fe(0.8)/Co—Fe—B(2.4)/Ni(4.8) sense layers after annealing for 5 hours at 280° C.

FIG. 5 shows $\Delta R_T/R_J$ versus $R_J A_J$ for TMR read sensors 201, 301 with Co—Fe(0.8)/Co—Fe—B(1.2)/Co—Hf(1.2)/Ni(5.6) and Co—Fe(0.8)/Co—Fe—B(2.4)/Ni(4.8) sense layers after annealing for 5 hours at 280° C. The Co—Fe—B sense layer 364 and the Ni sense layer 368 are deposited in one deposition module only, and thus an in-situ interface is formed between the Co—Fe—B sense layer 364 and the Ni sense layer 368. The thickness of the MgO$_x$ barrier layer 210 is labeled at data points.

To artificially form an ex-situ interface between the Co—Fe—B sense layer 364 and the Ni sense layer 368, the wafer is transferred to a "docking" module after the deposition of the Co—Fe—B sense layer 364, and is docked there for at least one minute before the deposition of the Ni sense layer 368. To reinforce the strength of the ex-situ interface, the vacuum, the ambient temperature and the docking time in the "docking" module can be optimized. For the TMR read sensors 201, 301 with 0.695 nm thick MgO$_x$ barrier layers 210, the entire removal of the Co—Hf sense layer 266 and the formation of the interface between the Co—Fe—B sense layer 364 and the Ni sense layer 368, $R_J A_J$ sharply increases from 0.51 to 0.70 $\Omega\text{-}\mu m^2$, indicating significant Ni diffusions at the MgO$_x$ barrier layer 210. However, by converting the in-situ interface into the ex-situ interface, $R_J A_J$ sharply decreases from 0.70 to 0.52 $\Omega\text{-}\mu m^2$, indicating that the ex-situ interface indeed plays a crucial role in suppressing the Ni diffusions.

Table 2 lists $H_F$, $R_J A_J$, $\Delta R_T/R_J$ and FoM for the TMR read sensors 201, 301 with 0.695 nm thick MgO$_x$ barrier layers 210 and various sense layers corresponding to those shown in FIG. 5. By replacing the Ni—Fe sense layer 368 with the Ni sense layer 368 in the TMR read sensors 201, $\lambda_S$ reaches as low as $-4.44 \times 10^{-6}$, $H_F$ as low as 137.6 Oe, and $\Delta R_T/R_J$ as high as 52.6% at $R_J A_J$ of 0.51 $\Omega\text{-}\mu m^2$ (corresponding to FoM of as high as 102.3). On the other hand, by replacing the Ni—Fe sense layer 368 with the Ni sense layer 368 in the TMR read sensors 301, $\lambda_S$ reaches as low as $-0.50 \times 10^{-6}$, $H_F$ as low as 145.8 Oe, and $\Delta R_T/R_J$ as high as 60/0.7% at $R_J A_J$ of 0.52 $\Omega\text{-}\mu m^2$ (corresponding to FoM of as high as 116.5).

nm thick ferromagnetic 75.2Co-2.2Fe-14.4B-8.2Hf film, a fourth sense layer 668 preferably formed of a 4.8 nm thick ferromagnetic Ni film, an ex-situ interface 670 between the first sense layer 662 and the second sense layer 664, an ex-situ interface 672 between the second sense layer 664 and the third sense layer 665, and an ex-situ interface 674 between the third sense layer 665 and the fourth sense layer 668. The total thickness of the first sense layer 662, the second sense layer 664 and the third sense layer 665 is large enough to form a long diffusion path for trapping Ni atoms. The thickness of the fourth sense layer 668 is adjusted accordingly for the sense layer structure 628 to preferably exhibit a total saturation areal moment of 0.56 memu/cm² (corresponding to that of an 8 nm thick ferromagnetic 88Ni-12Fe film sandwiched between two Cu films).

The Co—Fe—B—Hf sense layer 665 preferably has a Co content ranging from 60 to 76 at %, an Fe content ranging from 0 to 8 at %, a B content ranging from 16 to 24 at %, a Hf content ranging from 4 to 12 at %, and a thickness ranging from 0.8 to 2.4 nm. Its Hf content is preferably below 12 at % to reinforce the diffusion path for trapping Ni atoms while inducing low magnetic damping and noises, instead of above 20 at % to form a diffusion barrier layer for eliminating Ni diffusions while inducing high magnetic damping and noises. Since the saturation magnetization ($M_S$) of the Co—Fe—B—Hf sense layer 665 (489 memu/cm³) is much lower than that of the Co—Fe—B sense layer 664 (867 memu/cm³), the fourth sense layer 668 can be adjusted accordingly to be as thick as 4.8 nm, and thus $\lambda_S$ can be decreased.

In the alternative embodiment of the invention, the wafer is heated and then the Ta, Ru and Ir—Mn targets are also heated to deposit the Ta buffer layer 216, the Ru seed layer 218 and the Ir—Mn pinning layer 220, respectively. These hot depositions have been used in a prior art for a transformation from disordered to ordered phases in the Ir—Mn pinning layer 220, thereby enhancing antiferromagnetic/ferromagnetic coupling with the keeper layer structure 222 and inducing a higher $H_{UA}$. As a result, the keeper layer structure 222 and the reference layer structure 224 are more rigidly pinned, and thus magnetic noises induced by their tilting are expected to be reduced, even when the TMR read sensors 301, 601 are fabricated with smaller junction area and volume for magnetic recording at higher linear and track densities.

However, it becomes more challenging for the TMR read sensors 301, 601 to maintain their capabilities in suppressing the Ni diffusions. Although the wafer is cooled in another deposition module before subsequent depositions, the heat may not be dissipated completely and thus atomic mobility on sputtered surfaces may be still high enough to accelerate Ni

TABLE 2

| Co—Fe (nm) | Co—Fe—B (nm) | Co—Hf (nm) | Ni (nm) | $\lambda_S$ ($\times 10^{-6}$) | $H_F$ (Oe) | $R_J A_J$ ($\Omega\text{-}\mu m^2$) | $\Delta R_T/R_J$ (%) | FoM |
|---|---|---|---|---|---|---|---|---|
| 0.8 | 1.2 | 1.2 | 5.6 | −4.44 | 137.6 | 0.51 | 52.6 | 102.3 |
| 0.8 | 2.4 | 0 | 4.8 | −0.50 | 145.8 | 0.52 | 60.7 | 116.5 |

Figure 6:
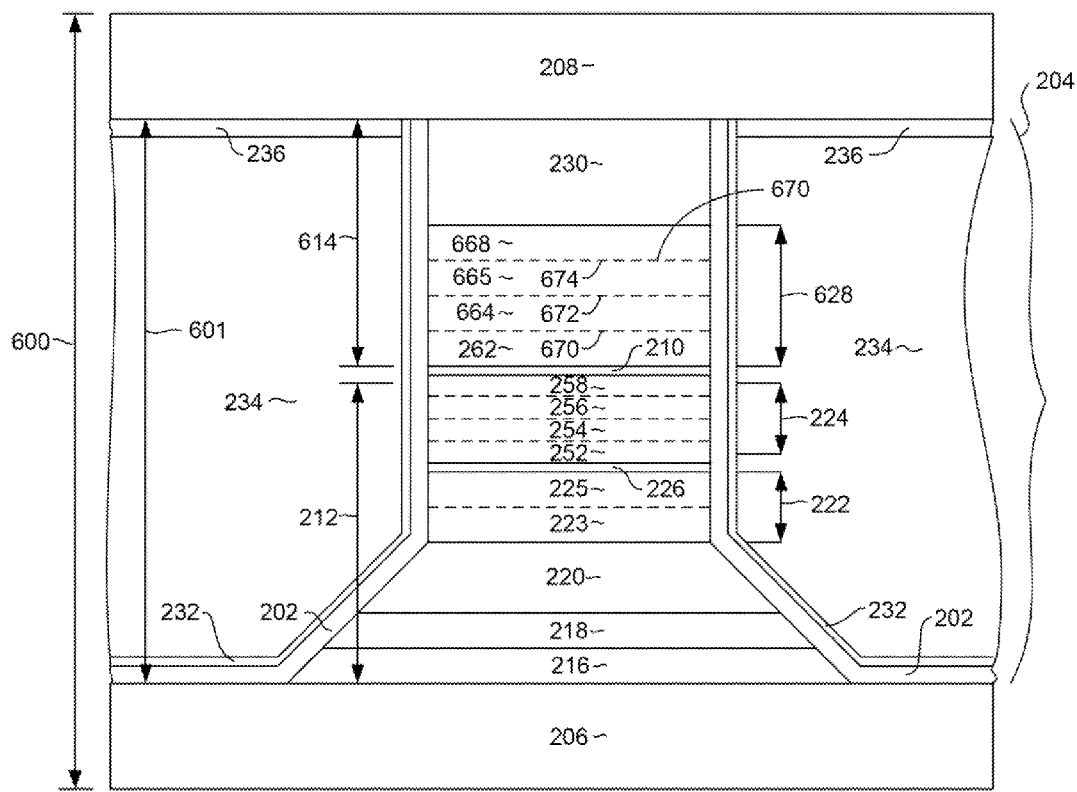
FIG. 6 is an ABS schematic view of a read head in accordance with an alternative embodiment of the invention.

FIG. 6 shows a read head 600 in accordance with an alternative embodiment of the invention. The read head 600 is basically identical to the read head 300 except the sense layer structure 628 in the upper sensor stack 614 of the TMR read sensor 601. The sense layer structure 628 comprises a first sense layer 662 preferably formed of a 0.8 nm thick ferromagnetic 46.8Co-53.2Fe film, a second sense layer 664 preferably formed of a 1.6 nm thick ferromagnetic 79.3Co-4.0Fe-16.7B film, a third sense layer 665 preferably formed of a 1.6 diffusions. In spite of this concern regarding the accelerated Ni diffusions, the concept of a long diffusion path in accordance with the invention is still feasible, as describe below.

To characterize the rigidity of the Co—Fe keeper layer 223, $H_{CE}$ and $H_{UA}$ of two samples are determined after annealing and then after baking. The first sample used for the TMR read sensors 201, 301 comprises a 2 nm thick Ta buffer layer 216, a 2 nm thick Ru seed layer 218, a 6 nm thick Ir—Mn pinning layer 220, a 3.6 nm thick Co—Fe keeper layer 223 with a saturation areal moment of 0.56 memu/cm$^2$ (corresponding to that of a 8 nm thick ferromagnetic 88Ni-12Fe film sandwiched into two Cu films), and a cap layer structure 230 formed of Ru(1)/Ta(1)/Ru(4) films. The second sample used for the TMR read sensor 601 is identical to the first sample, except that the Ta buffer layer 216, the Ru seed layer 218 and the Ir—Mn pinning layer 220 are deposited on a heated wafer by sputtering from heated Ta, Ru and Ir—Mn targets, respectively, and then the Co—Fe keeper layer 223 and the cap layer structure 230 are deposited after the wafer is cooled.

The annealing is conducted with a magnetic field of 50,000 Oe along a predetermined annealing direction (which will be perpendicular to the ABS after fabricating the read heads 200, 300, 600) for 5 hours at 280° C. in a high-vacuum oven. After cooling in the high-vacuum oven and in air, the two samples are measured with a vibrating sample magnetometer (VSM) and with a four-point probe. Magnetic responses are detected while applying a magnetic field to the sample in directions parallel and antiparallel to the annealing direction in the VSM. Electrical responses are detected while applying a sense current to the sample in a direction perpendicular to the annealing direction and applying a magnetic field to the sample in directions parallel and antiparallel to the annealing direction in the four-point probe.

The baking is conducted with a magnetic field of 5,000 Oe along a baking direction antiparallel to the annealing direction for 5 minutes at incrementally increasing baking temperatures ($T_B$) in a tube oven. The tube oven provides a hot environment similar to that in a disk drive where the TMR read sensors 201, 301, 601 operate. After baking at incrementally increasing $T_B$, thermal energies are accumulated to deteriorate the rigidity of the Co—Fe keeper layer 223. After cooling in the tube oven, the sample is measured with a four-point probe. Electrical responses are detected while applying a sense current to the sample in a direction perpendicular to the annealing direction and applying a magnetic field to the sample in directions parallel and antiparallel to the annealing direction in the four-point probe. The magnetic method is eliminated, since it is much slower than the electrical method, and sample vibrating may cause the sample to contact the wall of the tube oven, thus inducing magnetic noises.

Figure 7:
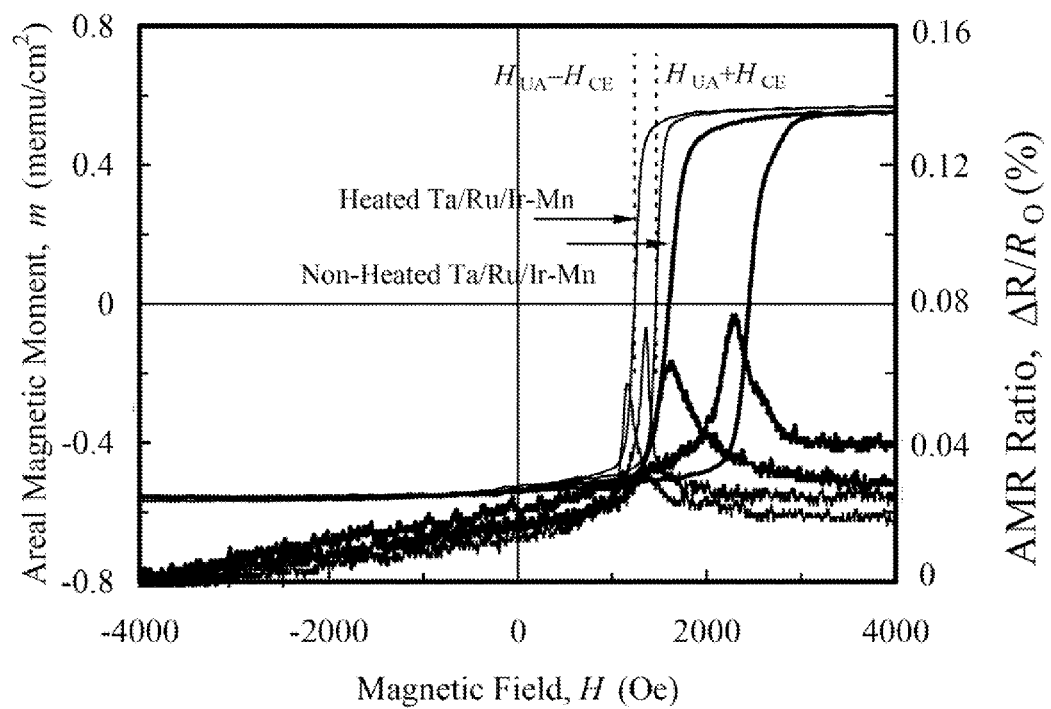
FIG. 7 is a chart showing magnetic and electrical responses of Co—Fe keeper layers with non-heated and heated Ta/Ru/Ir—Mn films after annealing for 5 hours at 280° C.

FIG. 7 shows magnetic and electrical responses of the Co—Fe keeper layer 223 with non-heated and heated Ta/Ru/Ir—Mn films after annealing for 5 hours at 280° C. The magnetic responses of each sample reveal one shifted hysteresis loop. As the magnetic field antiparallel to the annealing direction increases at $H_{UA}+H_{CE}$, it rotates the magnetization of the Co—Fe keeper layer 223 ($M_{CF}$) by 180° to the magnetic field, and thus its areal magnetic moment increases from minimal to maximal values. On the other hand, as the magnetic field decreases at $H_{UA}-H_{CE}$, $M_{CF}$ becomes free and rotates by 180° to the annealing direction, and thus its areal magnetic moment decreases from maximal to minimal values. The shifted hysteresis loop, which originates from antiferromagnetic/ferromagnetic coupling between the Ir—Mn pinning layer 220 and the Co—Fe keeper layer 223, is thus formed.

The half width and center of the shifted hysteresis loop determine $H_{CE}$ and $H_{UA}$, respectively. $H_{UA}$ is inversely proportional to the thickness of the Co—Fe keeper layer 223 ($\delta_{CF}$) and is thus extrinsic. It can be converted into an intrinsic antiferromagnetic/ferromagnetic coupling energy ($J_K$), defined as a product of the saturation magnetization of the Co—Fe keeper layer 223 ($M_S$), $\delta_{CF}$ and $H_{UA}$. With this magnetic method, FIG. 7 reveals that by heating the Ta/Ru/Ir—Mn films, $H_{CE}$ increases from 114.0 to 421.2 Oe, $H_{UA}$ increases from 1,350 to 2,025 Oe, and $J_K$ increases from 0.768 to 1.128 erg/cm$^2$.

On the other hand, the electrical responses of each sample reveal two peaks. As the magnetic field antiparallel to the annealing direction increases at $H_{UA}+H_{CE}$, it rotates $M_{CF}$ by 180° to the magnetic field. Since this $M_{CF}$ rotation induces an anisotropy magnetoresistance (AMR) effect, the resistance of the sample increases from a minimal value ($R_O$) when an angle between $M_{CF}$ and the sense current ($I_S$) is −90°, to a maximal value ($R_O+\Delta R_A$) when the angle reaches zero, and then to $R_O$ again when the angle reaches 90°. On the other hand, as the magnetic field decreases at $H_{UA}-H_{CE}$, $M_{CF}$ becomes free and rotates by −180° to the annealing direction. Since this $M_{CF}$ rotation also induces the AMR effect, the resistance of the sample increases from $R_O$ when the angle between $M_{CF}$ and $I_S$ is 90°, to $R_O+\Delta R_A$ when the angle reaches zero, and then to $R_O$ again when the angle reaches −90°. The two peaks exactly at $H_{UA}$ $H_{CE}$ and $H_{UA}-H_{CE}$, which originate from antiferromagnetic/ferromagnetic coupling between the Ir—Mn pinning layer 220 and the Co—Fe keeper layer 223, are thus formed.

The half distance and the midpoint between the two peaks define $H_{CE}$ and $H_{UA}$, respectively. In spite that the AMR effect characterized by $\Delta R_A/R_O$, defined as an AMR coefficient, is very small, the two peaks can be clearly observed, and thus $H_{CE}$ and $H_{UA}$ can be precisely determined. With this electrical method, FIG. 7 reveals that by heating the Ta/Ru/Ir—Mn films, $H_{CE}$, increases from 95.5 to 369.7 Oe, $H_{UA}$ increases from 1,265 to 1,998 Oe, and $J_K$ increases from 0.720 to 1.112 erg/cm$^2$. $H_{CE}$, $H_{UA}$ and $J_K$ attained with the electrical method is slightly lower than those attained with the magnetic method, probably due to that the angle between $M_{CF}$ and $I_S$ before detecting the electrical responses is not exactly 90°.

Figure 8:
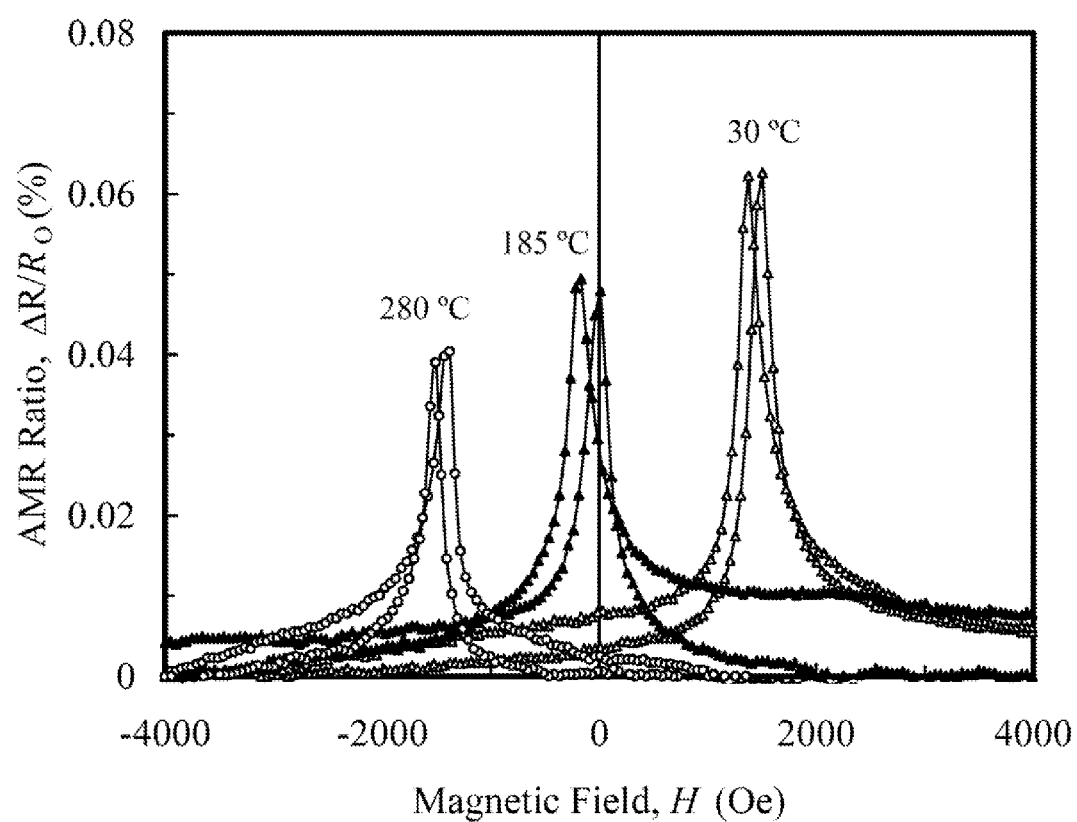
FIG. 8 is a chart showing electrical responses of a Co—Fe keeper layer with non-heated Ta/Ru/Ir—Mn films after baking at 30, 185 and 240° C.

FIG. 8 shows electrical responses of the Co—Fe keeper layer 223 with non-heated Ta/Ru/Ir—Mn films after baking at 30, 185 and 240° C. After baking at 30° C., $M_{CF}$ and $H_{UA}$ remain intact. After baking at 185° C., $M_{CF}$ is switched into a direction perpendicular to the annealing direction and thus $H_{UA}$ becomes zero. After baking at 240° C., $M_{CF}$ is switched into the baking direction, and thus $H_{UA}$ reaches a minimal value.

Figure 9:
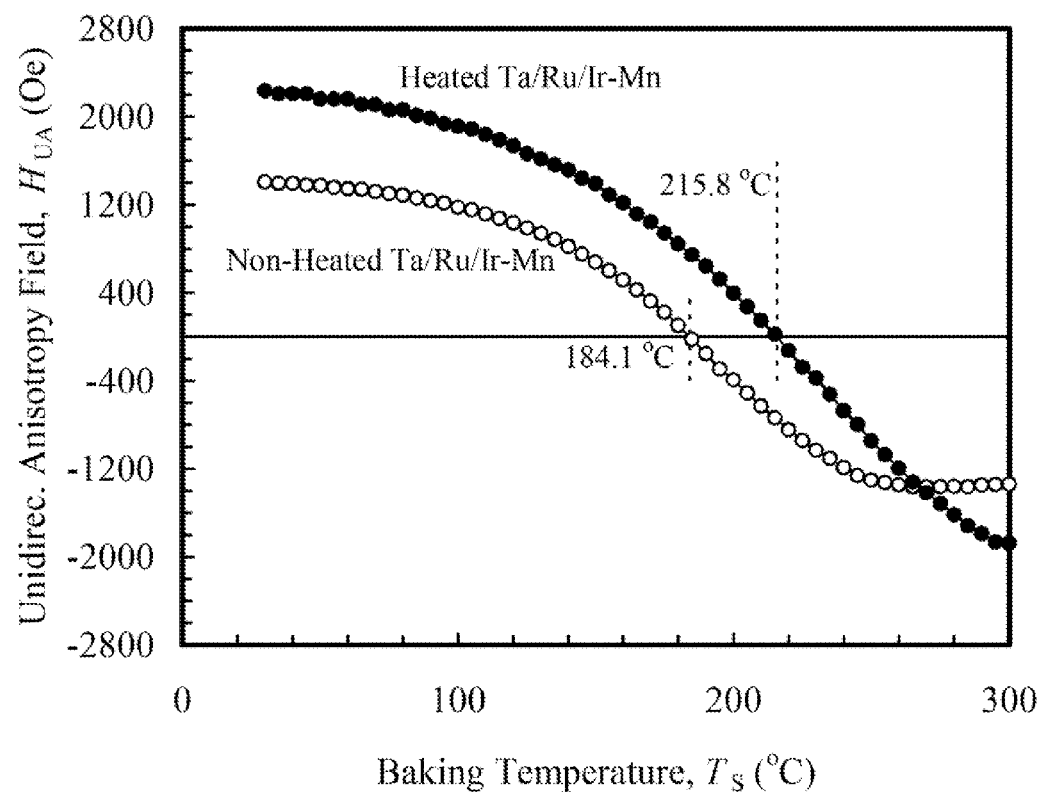
FIG. 9 is a chart showing $H_{UA}$ determined from electrical responses versus $T_B$ for Co—Fe keeper layers with non-heated and heated Ta/Ru/Ir—Mn films after baking at incrementally increasing $T_B$.

FIG. 9 shows $H_{UA}$ determined from the electrical responses versus $T_B$ for the Co—Fe keeper layer 223 with non-heated and heated Ta/Ru/Ir—Mn films after baking at incrementally increasing $T_B$. After baking at incrementally increasing $T_B$ lower than 185° C., $M_{CF}$ is gradually tilted away from the annealing direction and thus $H_{UA}$ gradually decreases from the maximal value to zero. After baking at incrementally increasing $T_B$ higher than 185° C., $M_{CF}$ is gradually tilted towards the baking direction, and thus $H_{un}$ gradually increases from zero to the minimal value. A critical $T_B$, after baking at which $M_{CF}$ is switched into the direction perpendicular to the annealing direction and thus $H_{UA}$ becomes zero, is defined as a switching temperature ($T_S$). A higher $T_S$ thus indicates that the rigidity of the Co—Fe keeper layer 223 will be more robust in the hot environment of the disk drive. FIG. 9 reveals that by heating the Ta/Ru/Ir—Mn films, $T_S$ substantially increases from 184.1 to 215.8° C.

In reality, the rigidity of the Co—Fe keeper layer 223 as described in FIGS. 7, 8 and 9 is still not enough to directly correlate with the reduction of magnetic noises in the TMR read sensors 201, 301, 601. The pinning mechanism in the TMR read sensors 201, 301, 601 is much more complicated since unidirectional and bidirectional anisotropies strongly interact with each other in the keeper layer structure 222 and the reference layer structure 224. To characterize the rigidity of the keeper layer structure 222 and the reference layer structure 224 in the prior at, however, the TMR read sensors 201, 301, 601 must be patterned to form a junction, through which the sense current can flow to induce a TMR effect.

To characterize the rigidity of the keeper layer structure 222 and the reference layer structure 224 in the invention, surprisingly, the electrical method can also be directly applied to the TMR read sensors 201, 301, 601 without patterning. Instead of the TMR effect, AMR effects of the keeper layer structure 222, the reference layer structure 224 and the sense layer structure 228 can be independently induced when the magnetic field rotates their magnetizations to form their own angles with the sense current. Due to these AMR effects, electrical responses of the keeper layer structure 222, the reference layer structure 224 and the sense layer structure 228 can be independently detected with the electrical method.

Figure 10:
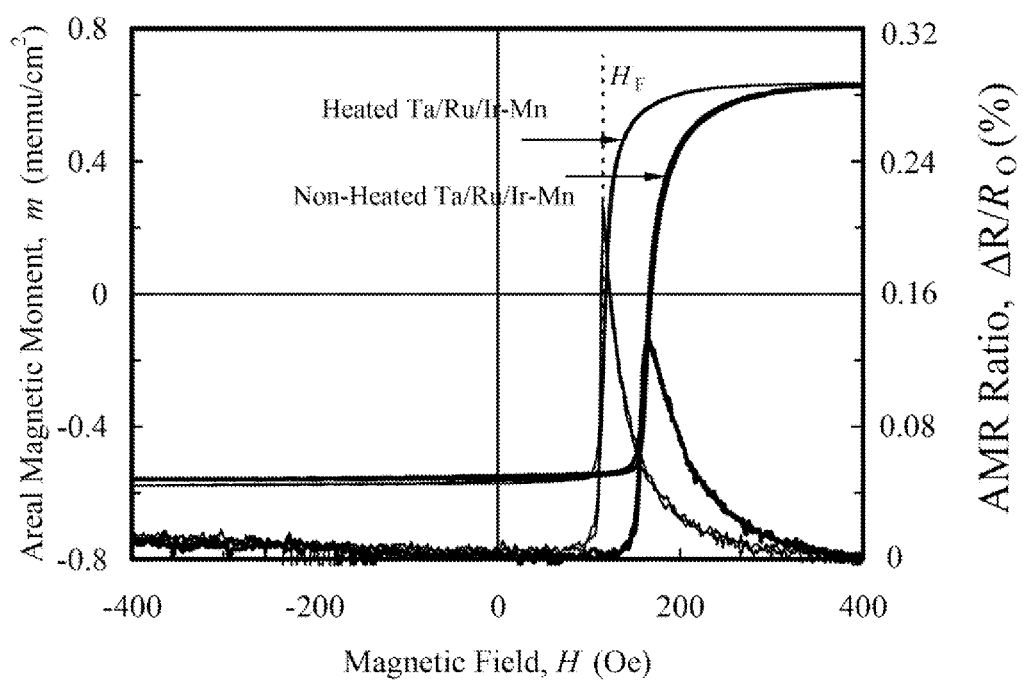
FIG. 10 is a chart showing low-field magnetic and electrical responses of TMR read sensors after annealing for 5 hours at 280° C.

FIG. 10 shows low-field magnetic and electrical responses of TMR read sensors 601 with non-heated and heated Ta/Ru/Ir—Mn films after annealing for 5 hours at 280° C. The magnetic field is so low that it will only rotate the magnetization of the sense layer structure 628 ($M_3$), while the magnetization of the keeper layer structure 222 ($M_1$) and the magnetization of the reference layer structure 224 ($M_2$) remain intact. The low-field magnetic responses of each TMR read sensor reveal one shifted hysteresis loop. As the magnetic field parallel to the annealing direction increases at $H_F+H_C$, it rotates $M_3$ by 180° to the magnetic field, and thus its areal magnetic moment increases from minimal to maximal values. On the other hand, as the magnetic field decreases at $H_F-H_C$, $M_3$ becomes free and rotates by −180° to its original direction antiparallel to the annealing direction, and thus its areal magnetic moment decreases from maximal to minimal values. The shifted hysteresis loop, which originates from ferromagnetic/ferromagnetic coupling between the reference layer structure 224 and the sense layer structure 628, is thus formed.

The half width and center of the shifted hysteresis loop determine $H_C$ and $H_F$, respectively. With this magnetic method, FIG. 10 reveals that by heating the Ta/Ru/Ir—Mn films, $H_C$ increases from 0.72 to 1.03 Oe, and $H_F$ increases from 118.9 to 167.3 Oe.

On the other hand, the low-field electrical responses of each TMR read sensor reveal two peaks. As the magnetic field parallel to the annealing direction increases at $H_F+H_C$, it rotates $M_3$ by 180° to the magnetic field. Since this $M_3$ rotation induces an AMR effect, the resistance of the TMR read sensor increases from a minimal value ($R_O$) when an angle between $M_3$ and $I_S$ is −90°, to a maximal value ($R_O+\Delta R_{43}$, where $\Delta R_{43}$ is an AMR coefficient of the sense layer structure 628) when the angle reaches zero, and then to $R_O$ again when the angle reaches 90°. On the other hand, as the magnetic field decreases at $H_F-H_C$, $M_3$ becomes free and rotates by −180° to its original direction. Since this magnetization rotation also induces the AMR effect, the resistance of the TMR read sensor increases from $R_O$ when the angle between $M_3$ and $I_S$ is 90°, to $R_O+\Delta R_{43}$ when the angle reaches zero, and then to $R_O$ again when the angle reaches −90°. The two peaks exactly at $H_F+H_C$ and $H_F-H_C$, which originate from the ferromagnetic/ferromagnetic coupling between the reference layer structure 224 and the sense layer structure 628, are thus formed.

The half distance and the midpoint between the two peaks define $H_C$ and $H_F$, respectively. With this electrical method, FIG. 10 reveals that by heating the Ta/Ru/Ir—Mn films, $H_C$ increases from 0.25 to 0.60 Oe, and $H_F$ increases from 115.6 to 165.4 Oe.

Figure 11:
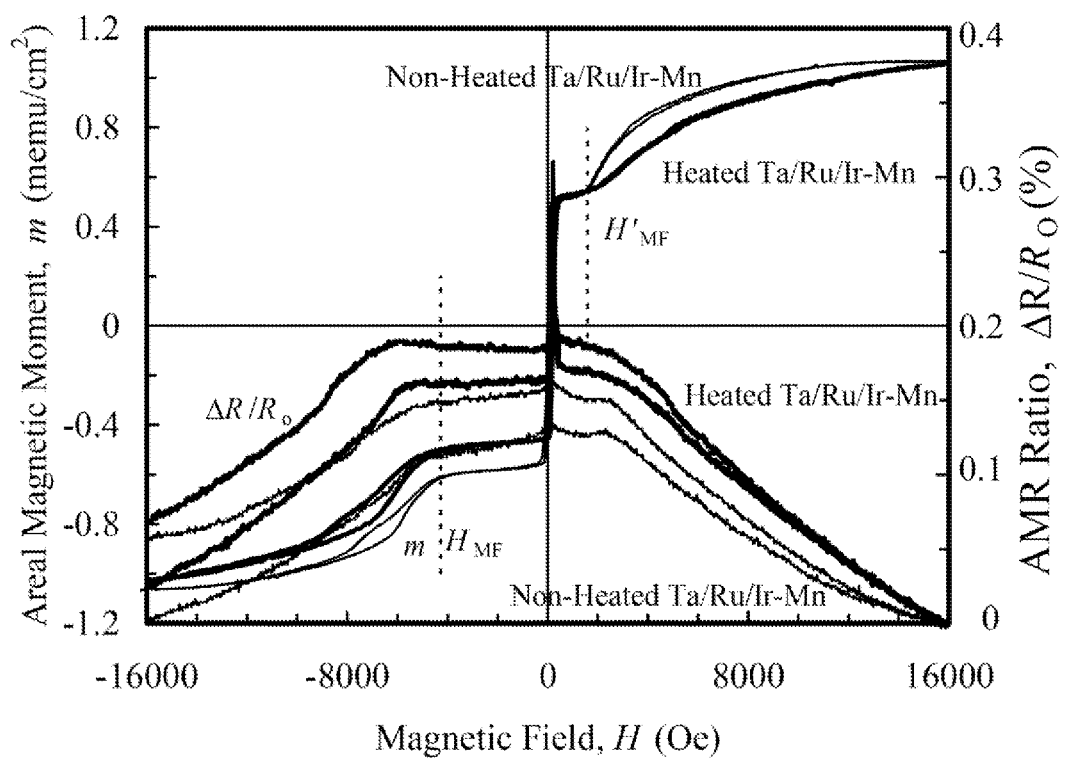
FIG. 11 is a chart showing high-field magnetic and electrical responses of TMR read sensors after annealing for 5 hours at 280° C.

FIG. 11 shows high-field magnetic and electrical responses of the TMR read sensors 601 with non-heated and heated Ta/Ru/Ir—Mn films after annealing for 5 hours at 280° C. The magnetic field is so high that in addition to fully orienting $M_3$ in the magnetic field, it causes synchronic flipping of $M_1$ and $M_2$. The high-field magnetic responses of each TMR read sensor reveal the shifted hysteresis loop as enlarged in FIG. 10 and two titled hysteresis loops. As the magnetic field antiparallel to the annealing direction increases at a magnetization flipping field ($H_{MF}$), synchronic flipping of $M_1$ and $M_2$ occurs. As the magnetic field antiparallel to the annealing direction decreases at $H_{MF}$, $M_1$ and $M_2$ are free from the synchronic flipping. One titled hysteresis loop, which originate from scissor-type rotations of $M_1$ and $M_2$ after the synchronic flipping, are thus formed. On the other hand, as the magnetic field parallel to the annealing direction increases at another magnetization flipping field ($H'_{MF}$), the synchronic flipping of $M_1$ and $M_2$ reoccurs. As the magnetic field parallel to the annealing direction decreases at $H'_{MF}$, $M_1$ and $M_2$ are free again from the synchronic flipping. The other titled hysteresis loop, which originate from scissor-type rotations of $M_1$ and $M_2$ after the synchronic flipping, are thus formed.

An intercepting point of one straight line drawn along the plateau of the tilted hysteresis loop and another straight line drawn along the slope of the titled hysteresis loop defines $H_{MF}$ or $H'_{MF}$. With this magnetic method, FIG. 11 reveals that by heating the Ta/Ru/Ir—Mn films, $H_{MF}$ increases from 4,290 to 5,506 Oe, and $H'_{MF}$ increases from 1,596 to 1,834 Oe.

On the other hand, the high-field electrical responses of each TMR read sensor reveal the two peaks as enlarged in FIG. 10 and four bumps. As the magnetic field antiparallel to the annealing direction increases at $H_{MF}$, synchronic flipping of $M_1$ and $M_2$ occurs, thus inducing two AMR effects and causing an increase in the resistance of the TMR read sensor ($R_{Sensor}$) by $\Delta R_{A1} \cos^2 \theta_1 + \Delta R_{A2} \cos^2 \theta_2$, where $\Delta R_{A1}$ and $\Delta R_{A1}$ are AMR coefficients of the keeper layer structure 222 and the reference layer structure 224, respectively, and $\theta_1$ and $\theta_2$ are angles between $M_1$ and $I_S$ and between $M_2$ and $I_S$ after the synchronic flipping, respectively. As the magnetic field antiparallel to the annealing direction decreases at $H_{MF}$, $M_1$ and $M_2$ are free from the synchronic flipping, thus inducing the two AMR effects again. Two bumps located at $H_{MF}$, which originate from the synchronic flipping, are thus formed. On the other hand, as the magnetic field parallel to the annealing direction increases at $H'_{MF}$, synchronic flipping of $M_1$ and $M_2$ reoccurs. As the magnetic field parallel to the annealing direction decreases at $H'_{MF}$, $M_1$ and $M_2$ are free again from the synchronic flipping. The other two bumps located $H'_{MF}$, which also originate from the synchronic flipping, are thus formed.

An intercepting point of one straight line drawn along a plateau at the bump and another straight line drawn along a cliff at the bump defines $H_{MF}$ or $H'_{MF}$. With this electrical method, FIG. 11 reveals that by heating the Ta/Ru/Ir—Mn films, $H_{MF}$ increases from 5,780 to 6,553 Oe, and $H'_{MF}$ increases from 2,286 to 2,338 Oe.

Figure 12:
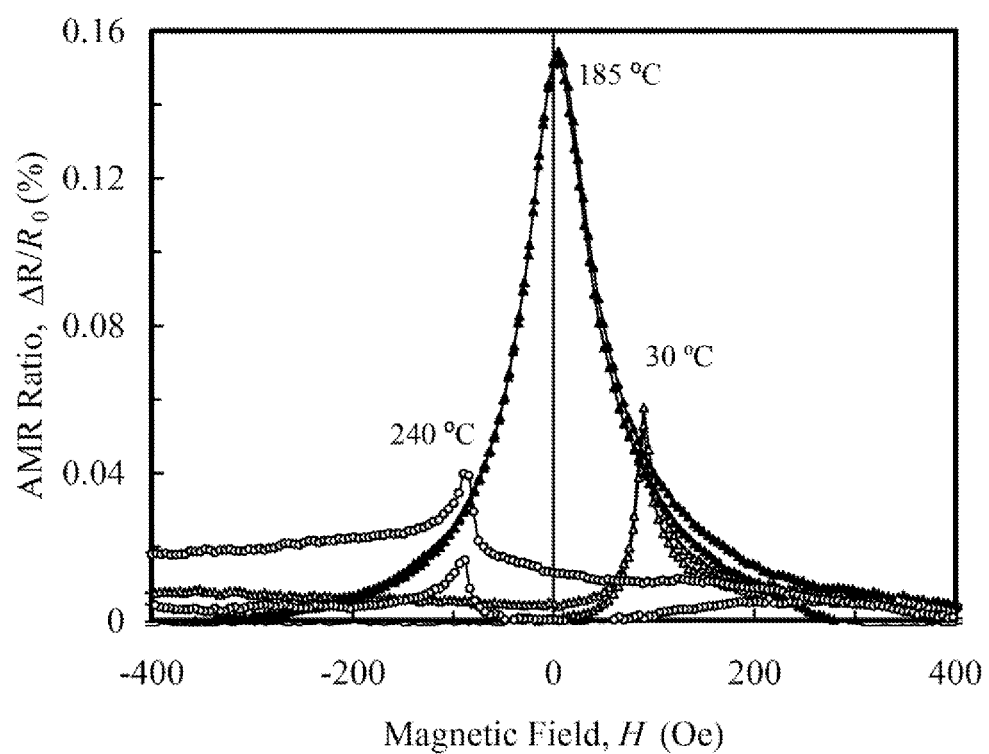
FIG. 12 a chart showing low-field electrical responses of TMR read sensors with non-heated Ta/Ru/Ir—Mn films after baking at 30, 185 and 240° C.

FIG. 12 shows low-field electrical responses of the TMR read sensors 601 with non-heated Ta/Ru/Ir—Mn films after baking at 30, 185 and 240° C. After baking at 30° C., $M_1$ remains in the annealing direction, $M_2$ remains in a direction antiparallel to $M_1$ due to antiparallel ferromagnetic/ferromagnetic coupling across the Ru spacer layer 226, and $M_3$ remains in the same direction as $M_2$ due to parallel ferromagnetic/ferromagnetic coupling across the $MgO_x$ barrier layer 210. When applying $I_S$ in a direction perpendicular to the annealing direction, $\theta_1$, $\theta_2$ and $\theta_3$, are −90°, 90° and 90°, respectively, and thus $R_{Sensor}$ remains at the lowest value ($R_O$). When applying the magnetic field in a direction parallel to the annealing direction, it must exceed the highest value ($H_F$) to rotate $M_3$ while $M_1$ and $M_2$ remain intact. After baking at 185° C., $M_1$ is switched into a direction perpendicular to the annealing direction, $M_2$ is synchronically flipped into a direction antiparallel to $M_1$, and $M_3$ is synchronically switched into the same direction as $M_2$. When applying $I_S$ in the direction perpendicular to the annealing direction, $\theta_1$, $\theta_2$ and $\theta_3$, are 0°, 180° and 180°, respectively, and thus $R_{Sensor}$ reaches the highest value ($R_O+\Delta R_{A1}+\Delta R_{A2}+\Delta R_{A3}$). No any magnetic fields in the direction parallel or antiparallel to the annealing direction are needed (i.e. $H_F=0$) to rotate $M_3$. After baking at 240° C., $M_1$ is switched into a direction antiparallel to the annealing direction, $M_2$ is synchronically flipped into a direction antiparallel to $M_1$, and $M_3$ is synchronically switched into the same direction as $M_2$. When applying $I_S$ in the direction perpendicular to the annealing direction, $\theta_1$, $\theta_2$ and $\theta_3$, are 90°, −90° and 90°, respectively, and thus $R_{Sensor}$ returns to the lowest value ($R_O$). When applying the magnetic field in a direction antiparallel to the annealing direction, it must exceed the highest value ($-H_F$) to rotate $M_3$ while $M_1$ and $M_2$ remain intact.

Figure 13:
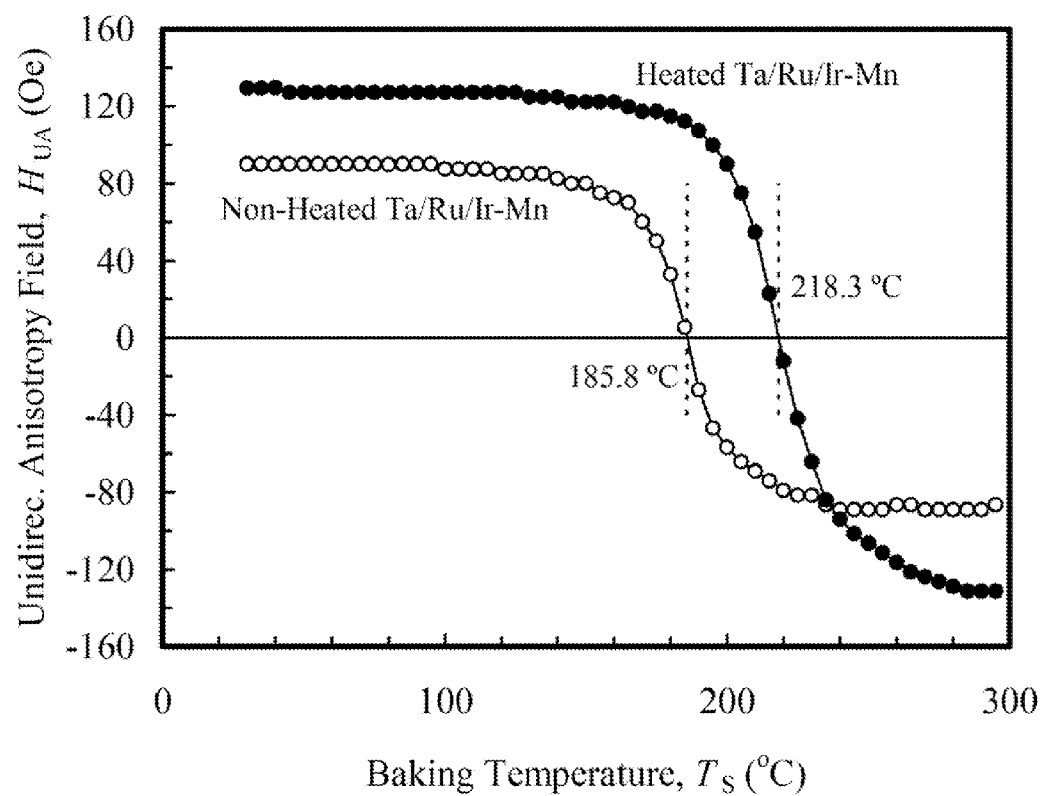
FIG. 13 is a chart showing $H_F$ determined from low-field electrical responses versus $T_B$ for TMR read sensors with non-heated and heated Ta/Ru/Ir—Mn films after baking at incrementally increasing $T_B$.

FIG. 13 shows $H_F$ determined from the low-field electrical responses versus $T_B$ for the TMR read sensors 601 with non-heated and heated Ta/Ru/Ir—Mn films after baking at incrementally increasing $T_B$. After baking at incrementally increasing $T_B$ lower than 185° C., $M_3$ is gradually tilted away from the annealing direction and thus $H_F$ gradually decreases from the highest value to zero. After baking at incrementally increasing $T_B$ higher than 185° C., $M_3$ is gradually tilted towards the baking direction and thus $-H_F$ gradually increases from zero to the highest value. A critical $T_B$, after baking at which $M_3$ is switched into a direction perpendicular to the annealing direction and thus $H_F$ becomes zero, is defined as a switching temperature ($T_S$). Since baking effects on $M_1$ tilting behaviors are equivalent to those on $M_2$ flipping behaviors and those on $M_3$ tilting behaviors, a higher $T_S$ thus indicates that the rigidity of the keeper layer structure 222 and the reference layer structure 224 will be more robust in the hot environment of the disk drive. FIG. 9 reveals that by heating the Ta/Ru/Ir—Mn films, $T_S$ substantially increases from 185.8 to 218.3° C.

Ideally, by investigating baking effects on $H_{MF}$ and $H'_{MF}$ with the high-field electrical method, the rigidity of the keeper layer structure 222 and the reference layer structure 224 can be directly characterized. Several difficulties will be encountered though. First, bumps at $H_{MF}$ and $H'_{MF}$ can only be identified vaguely when $M_2-M_1$ is preferably negative per a read sensor design, although they can be identified clearly when $M_2-M_1$ is non-preferably positive. Second, locating the bump with the interception method is uncertain, while locating the peak determined by a maximal value is precise. Third, when baking continues, the bumps gradually move to a low-filed region, where the peaks also move to with gradually increasing heights. As a result, the bumps are hidden by the peaks, so that they cannot be identified anymore.

Therefore, by investigating baking effects on $M_1$ tilting behaviors and $H_F$ with the low-field electrical method, the rigidity of the keeper layer structure 222 and the reference layer structure 224 can be characterized. It should be noted though that in the low-field electrical method, the TMR read sensors 601 must not be patterned to avoid inducing the TMR effect which is much larger than the AMR effect and thus hide it. Although the patterned TMR read sensors 601 can provide the TMR effect to ideally characterize the rigidity of the keeper layer structure 222 and the reference layer structure 224, it requires tedious wire bonding and careful loading into the tube oven. Most importantly, the low-field electrical method in accordance with the invention is the simplest and the fastest to characterize the rigidity of the keeper layer structure 222 and the reference layer structure 224.

FIG. 13 reveals that the rigidity of the keeper layer structure 222 and the reference layer structure 224 in the TMR read sensors 201, 301, 601 with heated Ta/Ru/Ir—Mn films will be more robust, and thus magnetic noises will be substantially reduced. To prove that any diffusion barrier layers are still not needed in spite of insufficient heat dissipation, the TMR sensors 201, 301 and 601 with hot Ta/Ru/Ir—Mn films are fabricated, tested and evaluated, as described below.

Figure 14:
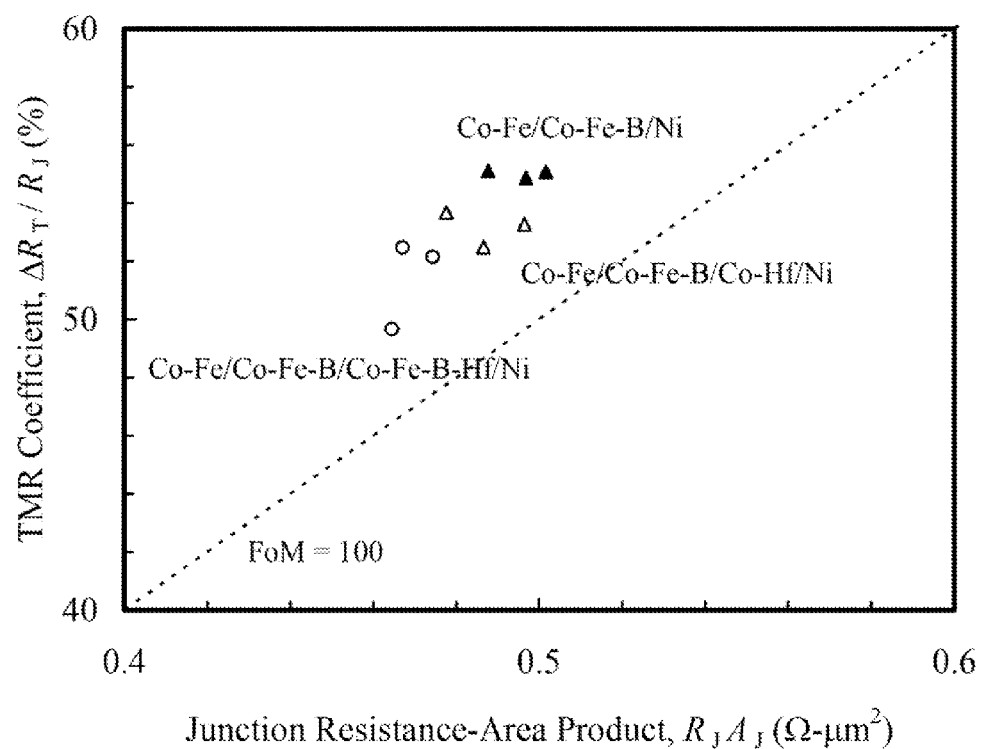
FIG. 14 is a chart showing $\Delta R_T/R_J$ versus $R_J A_J$ for TMR read sensors with Co—Fe(0.8)/Co—Fe—B(1.6)/Co—Hf(1.2)/Ni(5.0), Co—Fe(0.8)/Co—Fe—B(3.2)/Ni(4.0) and Co—Fe(0.8)/Co—Fe—B(1.6)/Co—Fe—B—Hf(1.6)/Ni(4.8) sense layers after annealing for 5 hours at 280° C.

FIG. 14 shows $\Delta R_T/R_J$ versus $R_JA_J$ for TMR read sensors 201, 301, 601 with hot Ta/Ru/Ir—Mn films and with Co—Fe (0.8)/Co—Fe—B(1.6)/Co—Hf(1.2)/Ni(5.0), Co—Fe(0.8)/Co—Fe—B(3.2)/Ni(4.0) and Co—Fe(0.8)/Co—Fe—B (1.6)/Co—Fe—B—Hf(1.6)/Ni(4.8) sense layers after annealing for 5 hours at 280° C. The thickness of the $MgO_x$ barrier layer 210 is 0.695 nm. By removing the Co—Hf sense layer 266, $R_JA_J$ slightly increases from 0.49 to 0.50 Ω-μm², indicating that the artificially formed ex-situ interface is still strong enough to suppress accelerated Ni diffusions caused by non-dissipated heat. On the other hand, by removing the Co—Hf sense layer 266 and lightly doping Hf atoms into the upper portion of the Co—Fe—B sense layer, $R_JA_J$ slightly decreases from 0.50 to 0.47 Ω-μm², indicating that the Co—Fe—B—Hf sense layer 665 can reinforce the diffusion path and thus further suppress the Ni diffusions.

Table 3 lists $H_F$, $R_JA_J$, $\Delta R_T/R_J$ and FoM for the TMR read sensors 201, 301 and 601 with hot Ta/Ru/Ir—Mn films and with various sense layers corresponding to those shown in FIG. 14. The TMR read sensors 201, 301, 601 exhibit comparable $\Delta R_T/R_J$ at $R_JA_J$ of around 0.50 Ω-μm². In addition, the uses of the Co—Fe—B—Hf sense layer 665 and the thicker Ni sense layer 668 cause a substantial decease in $\lambda_S$ from 1.52 to of $-1.2 \times 10^{-6}$. Ni atoms might be diffused into the Co—Fe—B—Hf sense layer 665 and trapped there, leaving the $MgO_x$ barrier layer intact and thus maintaining the high TMR effect.

TABLE 3

| Co—Fe (nm) | Co—Fe—B (nm) | Co—Fe—B—Hf (nm) | Co—Hf (nm) | Ni (nm) | $\lambda_S$ (×10⁻⁶) | $H_F$ (Oe) | $R_JA_J$ (Ω-μm²) | $\Delta R_T/R_J$ (%) | FoM |
|---|---|---|---|---|---|---|---|---|---|
| 0.8 | 1.6 | 0 | 1.2 | 5.0 | −3.69 | 114.5 | 0.49 | 53.2 | 109.2 |
| 0.8 | 3.2 | 0 | 0 | 4.0 | 1.52 | 124.6 | 0.50 | 55.0 | 111.1 |
| 0.8 | 1.6 | 1.6 | 0 | 4.8 | −1.29 | 167.9 | 0.47 | 51.4 | 109.8 |

While various embodiments have been described, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A read sensor, comprising:
a barrier layer sandwiched between a lower sensor stack and an upper sensor stack;
the lower sensor stack comprising:
a pinning layer;
a keeper layer structure on the pinning layer;
an antiparallel-coupling layer on the keeper layer structure; and
a reference layer structure on the antiparallel-coupling layer;
the upper sensor stack comprising:
a sense layer structure that includes a first layer comprising CoFe formed on the barrier layer, a second layer consisting of CoFeB having a thickness of 2 to 4.8 nm and formed directly on the first layer and a third layer consisting of NiFe formed directly on the second layer, wherein the total thickness of the first sense layer and the second sense layer is large enough to form a sufficiently long diffusion path to trap Ni atoms thereby preventing Ni atoms from migrating from the third layer to the barrier layer; wherein the sense structure has a diffusion path (defined as the total thickness of the first and second sense layers) of at least 3.2 nm; and
a cap layer structure on the sense layer structure.

2. The read sensor as in claim 1 further comprising:
a first interface between the first and second sense layers; and
second interface between the second and third sense layers, wherein the first and second interfaces form diffusion barriers to inhibit the migration of Ni therethrough.

3. The read sensor as in claim 2 wherein the first interface between the first and second sense layers is formed by deferring the deposition of the second sense layer after the deposition of the first sense layer by transferring a wafer on which the first sense layers is deposited through a transfer module, and exposing the wafer to vacuum for an exposure time ranging from 1 to 20 minutes.

4. The read sensor as in claim 2, wherein the second interface between the second and third sense layers is formed by deferring the deposition of the third sense layer after the deposition of the second sense layer by transferring a wafer on which the first and second sense layers are deposited through a transfer module, and exposing the wafer to vacuum for exposure time ranging from 1 to 20 minutes.

5. The read sensor as in claim 1, wherein the first sense layer has:
a Co content ranging from 40 to 80 at %;
an Fe content ranging from 20 to 60 at %; and
a thickness ranging from 0.6 to 1.2 nm.

6. The read sensor as in claim 1, wherein the second sense layer has:
a Co content ranging from 68 to 84 at %;
an Fe content not greater than 8 at %;
a B content ranging from 16 to 24 at %.

7. The read sensor as in claim 1, wherein the third sense layer has:
a Ni content ranging from 92 to 100 at %;
an Fe content not greater than 8 at %; and
a thickness ranging from 2 to 8 nm.

8. The read sensor as in claim 1, wherein the sense layer structure has a diffusion path (defined as the total thickness of the first and second sense layers) ranging from 3.2 to 4.8 nm.

* * * * *